US007439758B2

(12) United States Patent
Hayafuji

(10) Patent No.: US 7,439,758 B2
(45) Date of Patent: Oct. 21, 2008

(54) DISPLAY APPARATUS AND METHOD OF INSPECTING THE SAME

(75) Inventor: Akinori Hayafuji, Yonezawa (JP)

(73) Assignee: Tohoku Pioneer Corporation, Yamagata (JP)

( * ) Notice: Subject to any disclaimer, the term of this patent is extended or adjusted under 35 U.S.C. 154(b) by 28 days.

(21) Appl. No.: 11/640,955

(22) Filed: Dec. 19, 2006

(65) Prior Publication Data

US 2007/0146003 A1 Jun. 28, 2007

(30) Foreign Application Priority Data

Dec. 26, 2005 (JP) ............................ 2005-371438

(51) Int. Cl.
*G01R 31/00* (2006.01)

(52) U.S. Cl. ...................................................... 324/770

(58) Field of Classification Search ....................... None
See application file for complete search history.

(56) References Cited

FOREIGN PATENT DOCUMENTS

JP 2005-107003 A 4/2005

*Primary Examiner*—Paresh Patel
(74) *Attorney, Agent, or Firm*—Westerman, Hattori, Daniels & Adrian, LLP.

(57) ABSTRACT

Provided are a detection element Em used for controlling a value of a drive voltage for each light emitting element constituting a display pixel, and a leakage detection circuit 4 which separates the detection element Em from a current source I1 when this detection element Em is in a leakage state. Further provided are a pseudo leakage setup means 5 with which a potential of an anode terminal in the above-mentioned detection element can be set as a pseudo leakage potential which is a potential when the detection element is in the leakage state, and an operation detection means 6 to verify that the leakage detection circuit 4 operates normally when operating the above-mentioned pseudo leakage setup means 5.

15 Claims, 6 Drawing Sheets

NORMAL CASE

DISPLAY APPARATUS AND METHOD OF INSPECTING THE SAME

BACKGROUND OF THE INVENTION

1. Field of the Invention

The present invention relates to a display apparatus in which a large number of light emitting elements as display pixels are arranged, for example, in a matrix pattern, and in particular to a display apparatus having a compensation means for compensating for over-time changes etc. of the above-mentioned light emitting elements, and a method of inspecting the display apparatus.

2. Description of the Related Art

Since mobile phones, mobile information terminals (PDA), etc., are widespread, there is an increasing demand for a display panel which has a high definition image display function and can realize a thin shape and low power consumption. Thus, conventionally, a liquid crystal display panel has been employed in a large number of products as a display panel which fulfils the demand.

On the other hand, a display panel has been recently put into practical use by using an organic EL (electroluminescence) element which takes advantage of a characteristic of being a self-emitting type element, thus attracting attention as a next-generation display panel which replaces the conventional liquid crystal display panel. There is also part of the background that a light-emitting layer of the element employs an organic compound which can expect a good light-emission property, so that the organic EL display panel has as high an efficiency and long a lifetime as can be put into practical use.

The above-mentioned organic EL element equivalently exhibits a diode characteristic. When a forward voltage is applied which is equal to or greater than a constant voltage (light-emission threshold voltage =Vth) inherent to an element, light is emitted. It is known that light-emission brightness at this time is substantially proportional to a value (an amount) of current which flows through the element. On the other hand, as for the above-mentioned organic EL element, it is known that physical properties of the element change due to long term use and a forward voltage Vf becomes large. For this reason, the organic EL element causes a variation over time in which the brightness characteristic with respect to an applied voltage is lowered due to real operating time.

Furthermore, in a range where the value of the applied voltage is greater than that of the above-mentioned light-emission threshold voltage, the organic EL element has a characteristic that the greater the value of the applied voltage is, the larger the light-emission brightness is. However, the higher the temperature is, the smaller the light-emission threshold voltage is. Therefore, the EL element is in a state where it can emit light at a higher temperature with a smaller applied voltage. Thus, even if the same light-emittable voltage is applied, it has temperature dependency of the brightness that it is bright at a high temperature, and dark at a low temperature.

Especially, the above-mentioned variation over time and the temperature dependency appear considerably, when the EL element is driven at the constant voltage. This is because the forward impedance of the element changes with a total drive period and ambient temperature so that the current which flows through the EL element changes.

Then, apart from the EL element which is arranged at the display panel and performs luminescence display, the present applicant has already filed a patent application with respect to a display apparatus having an EL element for monitoring (for detection) which measures a forward voltage Vf, in which a drive voltage from a power supply unit for driving the display panel is controlled by using the forward voltage Vf obtained with the EL element for monitoring. This is disclosed in patent document 1 as shown below, etc.

[Patent Document 1] Japanese Patent Publication (KOKAI) No. 2005-107003

FIG. 1 shows a basic structure of the display apparatus as disclosed in the above-mentioned patent document, provided with a current source I1 for supplying constant current in a forward direction to a detection element Em, and a detection circuit 1 for detecting the forward voltage Vf produced at an anode terminal of the detection element Em at this time. The above-mentioned detection circuit 1 is constituted by a sample and hold circuit, for example. A voltage corresponding to the above-mentioned forward voltage Vf detected by this detection circuit 1 is applied as a control voltage to a booster circuit (DC-DC converter) 2 which uses a battery as a primary power supply, for example.

The above-mentioned booster circuit 2 controls a DC output value corresponding to the forward voltage Vf obtained by the detection element Em, and functions as the power supply unit of a display panel 3 in which a large number of display elements (represented by EL element) E1, E2, E3, . . . , are arranged as pixels. In this case, it is preferable that the above-mentioned detection element Em is formed simultaneously with film formation process for the display elements E1, E2, E3, . . . , at the display panel 3, thus being able to match both electric characteristics and also to be able to match both environmental temperatures under display operation.

According to the structure as shown in FIG. 1 disclosed in the above-mentioned patent document, the drive voltage is controlled which is supplied from the power supply unit (booster circuit 2) corresponding to the variation over time of EL element or the change of environmental temperature, and the change of the luminescence characteristics by the variation over time of the EL element etc. can be inhibited. Further, according to this structure, since the voltage value required for causing and driving the EL element to emit light can be always secured without providing the above-mentioned power supply unit with an excessive voltage margin, thus being able to improve the usage efficiency of the power supply.

Incidentally, as described above, according to the structure provided with the detection element, a problem arises in that a suitable drive voltage cannot be obtained in the power supply unit of the display panel 3 when the detection element itself has an obstacle. For example, when leakage takes place in the above-mentioned detection element itself, according to a level of the leakage the above-mentioned forward voltage Vf from the detection element falls, and accordingly an output voltage from the power supply unit for driving the above-mentioned panel falls. Thus, it is impossible to expect normal display operation in the display panel.

In order to cope with such a problem, as described above, it is possible to have a leakage detection means for detecting whether or not the leakage takes place in the detection element, so as to selectively stop the supply of the constant current from the above-mentioned current source I1 to the detection element where the leakage has occurred. By providing the above-mentioned leakage detection means it is possible to stop use of the detection element where the leakage has occurred, whereby a suitable drive voltage can be obtained in the above-mentioned power supply unit.

However, when control is carried out to stop use of the detection element where the leakage has occurred, it is assumed that the above-mentioned leakage detection means for performing the control operation is operating normally. When the above-mentioned leakage detection means does not operate normally, a basic operation of stopping use of the detection element where the leakage has occurred cannot be guaranteed.

SUMMARY OF THE INVENTION

In view of the above-mentioned technical viewpoint, the present invention has been made and aims to provide a display apparatus having, in addition to the above-mentioned leakage detection means, a function to verify whether or not the leakage detection means operates normally, in which the above-mentioned variation over time and temperature compensation operation can reliably carried out by using the detection element, and a method of inspecting the apparatus.

A fundamental preferred embodiment of the display apparatus in accordance with the present invention made in order to solve the above-mentioned problem, is a display apparatus arranged to have a plurality of light emitting elements constituting a display pixel, a detection element for acquiring a voltage value corresponding to a forward voltage of each of the above-mentioned light emitting elements in order to control a value of a drive voltage for displaying and driving each of the above-mentioned light emitting elements, and a current source for supplying current to the above-mentioned detection element in order to acquire the above-mentioned voltage value from the above-mentioned detection element, the above-mentioned display apparatus including a leakage detection means for detecting whether or not leakage takes place in the above-mentioned detection element so as to interrupt the current supply from the above-mentioned current source to the above-mentioned detection element when detecting a leakage state of the detection element, and a pseudo leakage setup means which can set a potential of an anode terminal of the above-mentioned detection element as a pseudo leakage potential which is a potential where the detection element is in the leakage state.

Further, a fundamental preferred embodiment of the method of inspecting the display apparatus in accordance with the present invention made in order to solve the above-mentioned problem, is a method of inspecting a display apparatus having a plurality of light emitting elements constituting a display pixel, a detection element for acquiring a voltage value corresponding to a forward voltage of each of the above-mentioned light emitting elements in order to control a value of a drive voltage for displaying and driving each of the above-mentioned light emitting elements, and a leakage detection means for detecting whether or not leakage takes place in the above-mentioned detection element so as to interrupt the current from the current source for supplying the current to the above-mentioned detection element when detecting a leakage state of the above-mentioned detection element, wherein a pseudo leakage setup operation of setting a potential of an anode terminal of the above-mentioned detection element as a pseudo leakage potential which is a potential where the detection element is in the leakage state is carried out.

DESCRIPTION OF THE PREFERRED EMBODIMENTS

Figure 1:
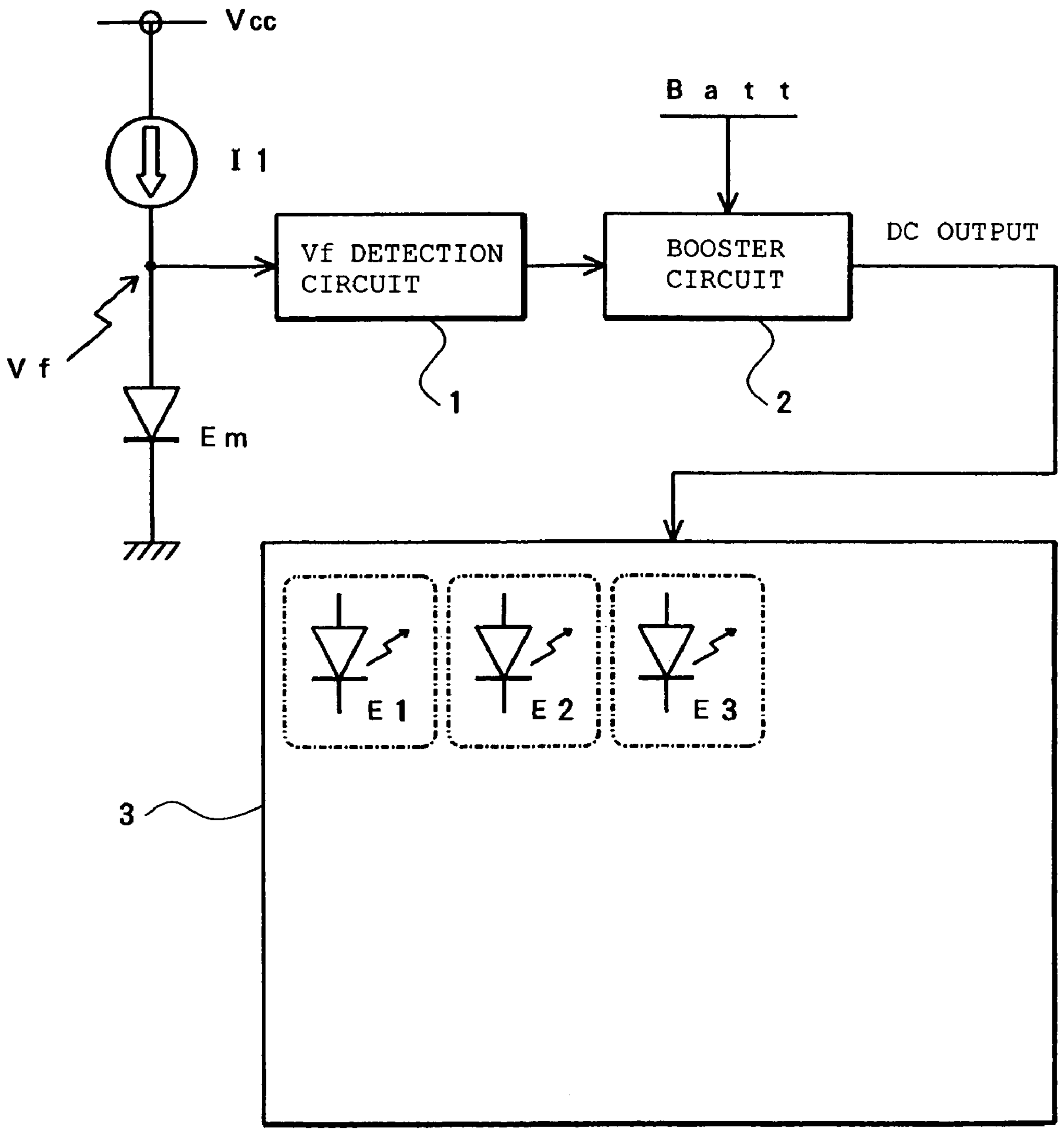
Fig. 1 (PRIOR ART)
FIG. 1 is a block diagram showing an example of a structure of a conventional display apparatus.

A display apparatus and a method of inspecting the display apparatus in accordance with the present invention will be described with reference to preferred embodiments as shown in the drawings. In addition, also the display apparatus in accordance with the present invention basically employs the structure as shown in FIG. 1. In other words, it is arranged that the current source I1 for supplying constant current to the detection element Em is provided, and the drive voltage for the plurality of light emitting elements E1, E2, E3, . . . constituting the display pixels arranged at the display panel 3 may be controlled based on the forward voltage Vf produced at the anode terminal of the detection element Em at this time.

Figure 2:
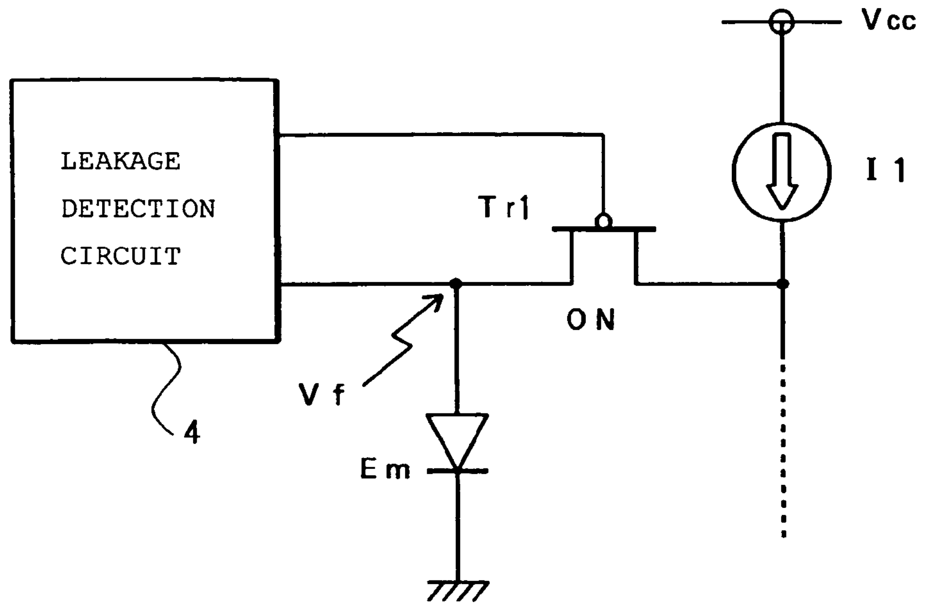
FIG. 2 is a circuit diagram of a display apparatus in accordance with the present invention, showing a structure of a leakage detection means added to the structure as shown in FIG. 1.
Figure 3:
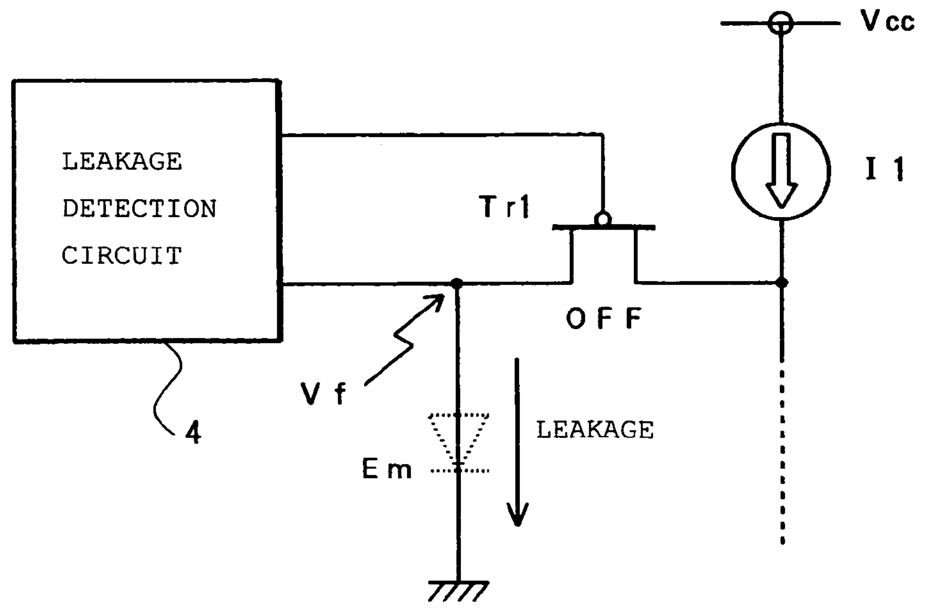
FIG. 3 is a circuit diagram for explaining a case where a detection element is in a leakage state.

In addition to the structure as shown in FIG. 1, the display apparatus in accordance with the present invention employs the structures as shown in FIGS. 2-7. Firstly, FIGS. 2 and 3 show structures of a leakage detection means for verifying whether or not the leakage takes place in the above-mentioned detection element Em. This leakage detection means is constructed of a transistor Tr1 constituted by a p-channel type TFT (thin film transistor) whose source and drain are inserted and connected between the above-mentioned current source I1 and the detection element Em, and a leakage detection circuit 4 which detects the forward voltage Vf of the above-mentioned detection element Em, controls a gate voltage of the above-mentioned transistor Tr1, and causes the transistor Tr1 to be in an OFF state when the voltage value is smaller than a predetermined value.

In other words, the above-mentioned leakage detection circuit 4 detects the forward voltage Vf of the detection element Em. When the voltage value Vf is equal to or greater than the predetermined value, it controls the transistor Tr1 to maintain an ON state as shown in FIG. 2. Therefore, the above-mentioned booster circuit (power supply unit) 2 generates the drive voltage (DC output) of a suitable value for lighting and driving each of the light emitting elements E1, E2, E3, . . . of the display panel 3, by means of the forward voltage Vf produced at the anode terminal of the detection element Em in this state.

On the other hand, as shown in FIG. 3, when the leakage takes place in the above-mentioned detection element Em, a value of the forward voltage Vf produced at the anode terminal of the above-mentioned detection element Em falls. Thus, the leakage detection circuit 4 operates to control the gate voltage of the above-mentioned transistor Tr1, cause the transistor Tr1 to be in the OFF state, and interrupt the current supply from the above-mentioned current source I1 to the above-mentioned detection element Em. In addition, although not shown, the circuit structures as shown in FIGS. 2 and 3 are similarly constituted with respect to other separately provided plural detection elements Em, which are connected in parallel with the above-mentioned current source I1, respectively.

Therefore, the detection element Em where the leakage takes place as shown in FIG. 3 operates so that it may be separated from the current source I1 by way of the above-mentioned operation, thus being able to control the output voltage of the power supply unit by using the forward voltage Vf produced at other normal detection elements Em. In addition, the function of the above-mentioned leakage detection circuit 4 can be realized by means of an easy analog logic circuit which is a combination of a very small number of TFT's.

Incidentally, as described above, in order to guarantee the basic operation of excluding the detection element where the leakage takes place, it is assumed that the above-mentioned leakage detection means operates normally. Therefore, it is desirable that the function to verify whether or not the leakage detection means operates normally is provided.

Figure 4:
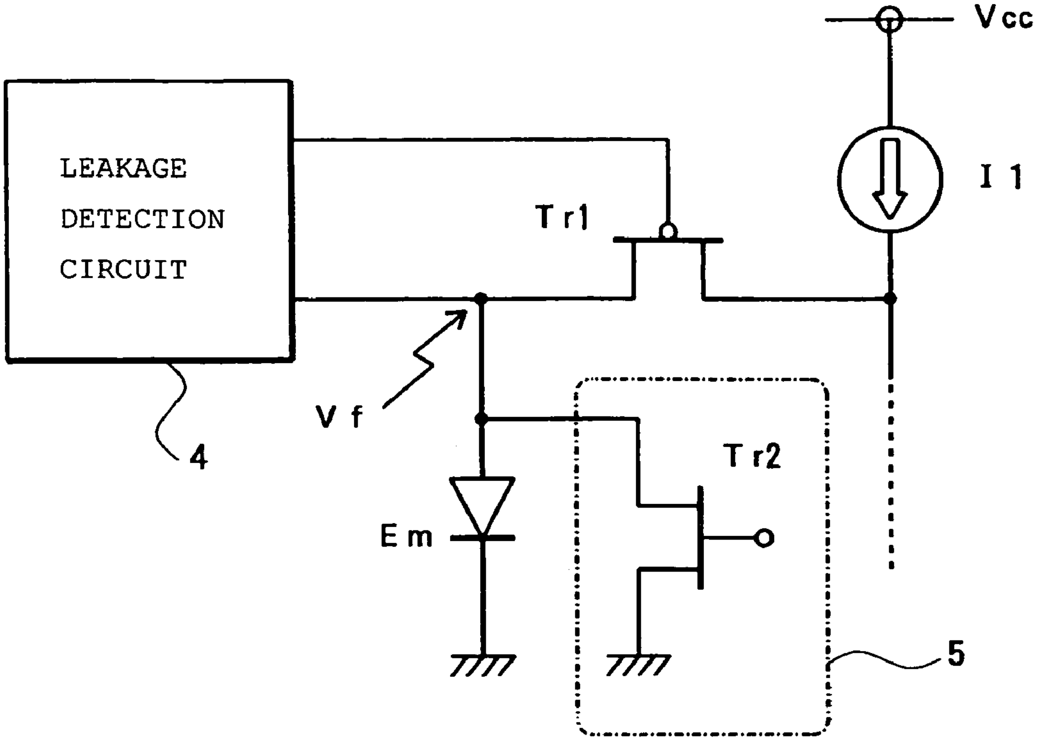
FIG. 4 is a circuit diagram in which a pseudo leakage setup means is added to the structure as shown in FIG. 2.
Figure 5:
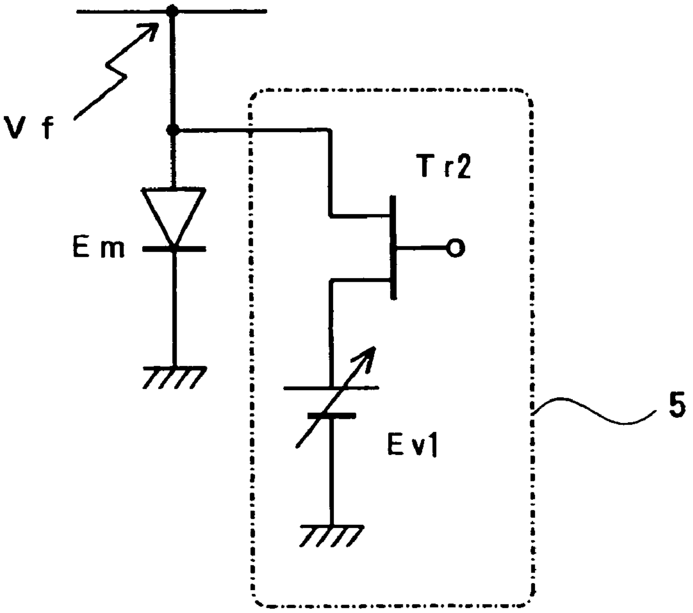
FIG. 5 is a circuit diagram showing another example of the pseudo leakage setup means.
Figure 6:
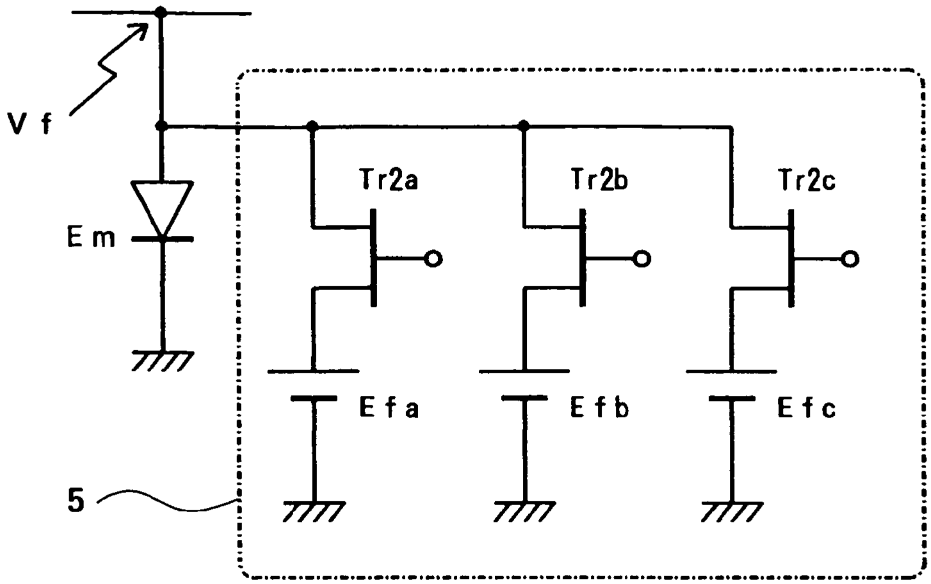
FIG. 6 is a circuit diagram showing still another example of the pseudo leakage setup means.

In addition to the above-mentioned leakage detection means, FIGS. 4-6 show examples of structures provided with a pseudo leakage setup means for reproducing that the detection element is in a leakage state.

This pseudo leakage setup means functions so that the potential of the anode terminal of the above-mentioned detection element Em, i.e., the above-mentioned Vf may be set as the pseudo leakage potential which is a potential when the detection element is in the leakage state. By way of an example of this pseudo leakage setup means 5, as shown in FIG. 4 it can be constructed of a transistor Tr2 which is constituted by an n-channel type TFT (thin film transistor) whose drain and source are connected with the anode terminal and a cathode terminal of the detection element Em.

In the preferred embodiment as shown in this FIG. 4, the above-mentioned transistor Tr2 is arranged to function as a switch which is caused to be in the ON or OFF state according to a control signal provided for its gate. Therefore, the above-mentioned transistor Tr2 which constitutes the pseudo leakage setup means 5 is set as the ON state, thus being possible to reproduce that the leakage in a short circuit state takes place in the above-mentioned detection element Em. In other words, the potential of the anode terminal of the detection element Em at this time is set up so that it may be set to substantially 0 V.

Therefore, in the case where the above-mentioned transistor Tr2 as the pseudo leakage setup means is set as the ON state, when the above-mentioned transistor Tr1 which constitutes the leakage detection means is in the OFF state, then it is verified that the above-mentioned leakage detection means operates normally.

Incidentally, the leakage at the above-mentioned element may not necessarily be leakage in a short circuit state, but leakage in a state (minute leakage state) where a certain amount of forward voltage Vf is generated according to the leakage state.

FIG. 5 reproduces a case where such leakage occurs, and illustrates an example in which it is possible to verify whether or not the above-mentioned leakage detection means operates certainly even when the level of the leakage is low. In addition, FIG. 5 mainly shows a component of the pseudo leakage setup means 5 connected to the anode terminal of the detection element Em.

The pseudo leakage setup means 5 as shown in this FIG. 5 illustrates an example in which it is arranged that the pseudo leakage potential set up by this can be variably set up, and a variable voltage supply Ev1 is connected with the above-mentioned transistor Tr2 in series. As described above, the above-mentioned transistor Tr2 is arranged to function as the switch which is caused to be in the ON or OFF state according to the control signal provided for its gate.

Therefore, according to the structure as shown in FIG. 5, the voltage value of the variable voltage supply Ev1 is selected to be a suitable value so that the above-mentioned minute leakage state can be reproduced. Thus, in the case where the above-mentioned transistor Tr2 as the pseudo leakage setup means is set as the ON state, when the above-mentioned transistor Tr1 which constitutes the leakage detection means is in the OFF state, then it is verified that the above-mentioned leakage detection means operates normally.

Furthermore, FIG. 6 shows another example in which the leakage state (minute leakage state) of the element where a certain amount of forward voltage Vf is generated can be reproduced. In addition, also FIG. 6 is mainly shows a component of the pseudo leakage setup means 5 connected to the anode terminal of the detection element Em. The pseudo leakage setup means 5 as shown in this FIG. 6 illustrates an example in which it is arranged that at least one potential out of a plurality of types of potentials is selectively set up as the above-mentioned pseudo leakage potential.

In other words, in the preferred embodiment as shown in FIG. 6, respective drains of three switching transistors Tr2*a*, Tr2*b*, and Tr2*c* are connected to the anode terminal of the above-mentioned detection element Em. Each of constant voltage supplies Efa, Efb, and Efc from which different voltage values are outputted is connected between each source of a respective one of the above-mentioned transistors and a reference potential point (i.e., cathode terminal of detection element Em).

The output voltage values by means of the above-mentioned constant voltage supplies Efa, Efb, and Efc are respectively set as suitable values lower than the normal forward voltage Vf of the above-mentioned detection element Em, and the above-mentioned switching transistors Tr2*a*, Tr2*b*, and Tr2*c* are alternatively controlled to be in the ON state, so that the above-mentioned minute leakage state of the element can be reproduced.

Therefore, in the case where any of the above-mentioned transistors Tr2*a*, Tr2*b*, or Tr2*c* as the pseudo leakage setup means is set as the ON state, when the above-mentioned transistor Tr1 which constitutes the leakage detection means is in the OFF state, then it is verified that the above-mentioned leakage detection means operates normally.

In this case, where any one of the above-mentioned transistors Tr2*a*, Tr2*b*, and Tr2*c* which function as the pseudo leakage setup means is caused to be in an ON operation, if the setup of the output voltage values by means of the constant voltage supplies Efa, Efb, and Efc is devised so that the transistor Tr1 which constitutes the above-mentioned leakage detection means may not be in the OFF state, then a threshold value characteristic with which the leakage detection means operates can also be verified.

Figure 7:
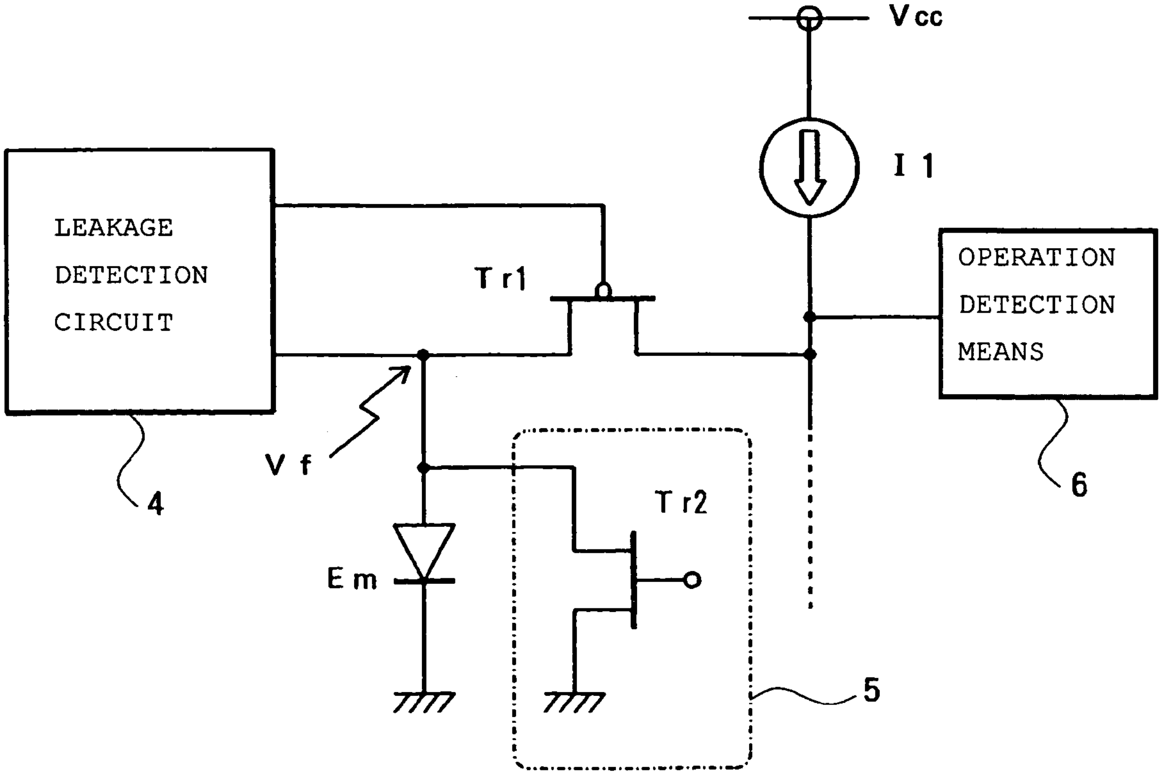
FIG. 7 is a circuit diagram in which an operation detection means is further added to the structure as shown in FIG. 4.

In addition, when the state of the pseudo leakage is set up by the above-mentioned pseudo leakage setup means 5, the above-mentioned transistor Tr1 which constitutes the above-mentioned leakage detection means is caused to be in the OFF state, whereby the operation of the leakage detection means is verified. While, FIG. 7 shows an example of an operation detection means which can easily detect that the above-mentioned transistor Tr1 is in the OFF state.

This operation detection means 6 is illustrated by an example in which this is added to the structure shown in FIG.

4, as already described. In other words, in the above-described preferred embodiments, where the state of pseudo leakage is set up by the pseudo leakage setup means 5, when the leakage detection means operates normally, the transistor Tr1 is in the OFF state and operates so that the detection element which is caused to be in the pseudo leakage state may be separated. However, when the leakage detection means does not operate normally, the detection element which is caused to be in the pseudo leakage state is not separated, therefore the voltage value at an output terminal of the above-mentioned current source I1 is reduced to be lower than the predetermined value.

The above-mentioned operation detection means 6 detects a change of the voltage value in the output terminal of the above-mentioned current source, and detects that the leakage detection means is operating normally. In other words, as is clear from the above description of the operation, when operating the pseudo leakage setup means 5 and when the above-mentioned operation detection means 6 detects that the voltage value in the output terminal of the above-mentioned current source I1 is reduced to be lower than the predetermined value, it is possible to determine that the leakage detection means is not operating normally. In this case, by outputting an unusual signal from the above-mentioned operation detection means 6, it is possible to report that the leakage detection means is not normal.

Further, when the pseudo leakage setup means 5 shown in FIGS. 5 and 6 as already described is employed, the operation detection means 6 shown in FIG. 7 can be employed suitably.

Figure 8A:
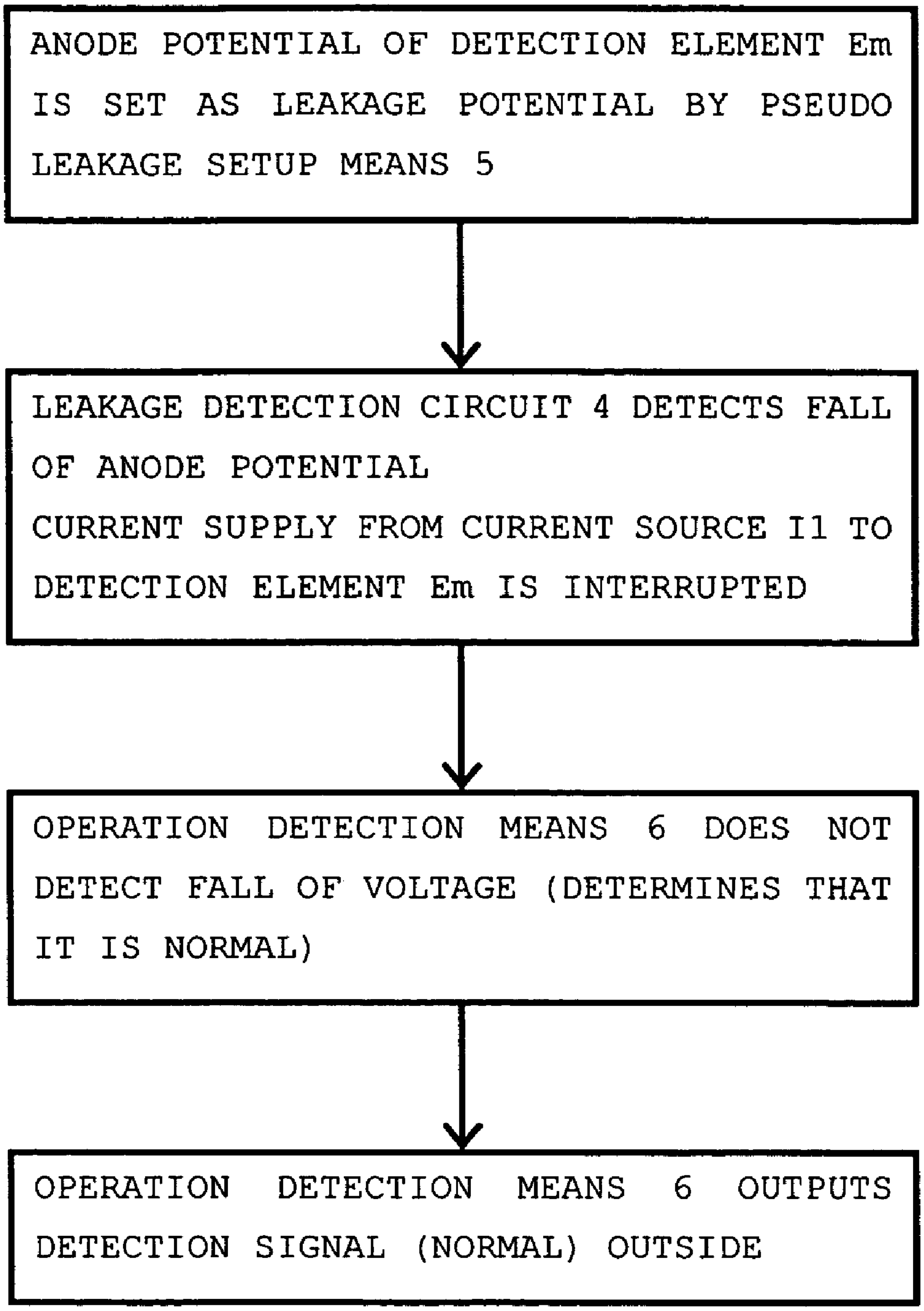
FIG. 8A is a flow chart for verifying the leakage detection means operates normally by means of an operation detection means.
Figure 8B:
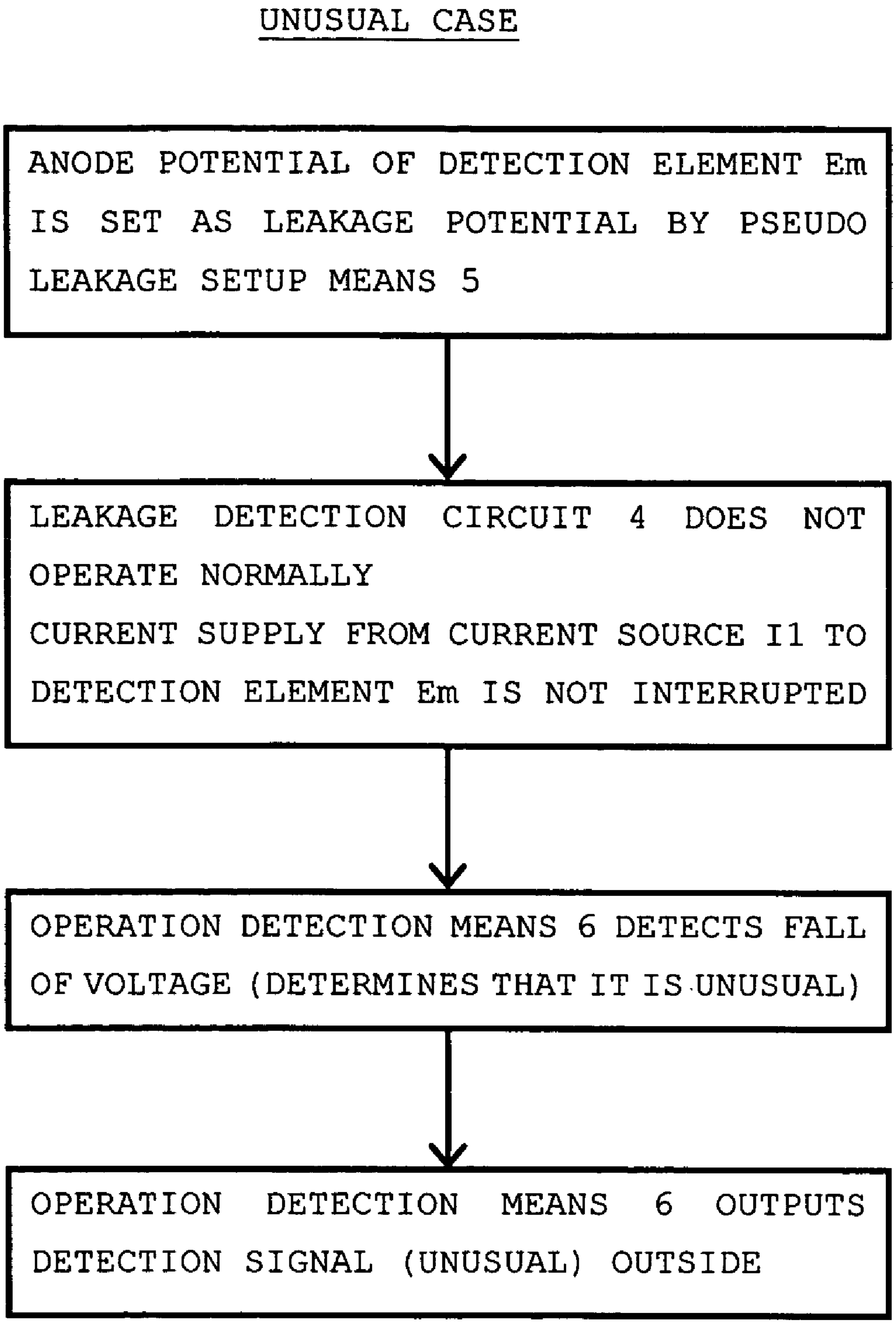
FIG. 8B is a flow chart for verifying the leakage detection means operates unusually by means of an operation detection means.

FIG. 8A, 8B show flows in which in the case of setting up the pseudo leakage state by the pseudo leakage setup means 5 as described above, it is verified whether or not the leakage detection means operates normally by using the operation detection means 6, where FIG. 8A shows the case of being normal and FIG. 8B shows the case of being unusual.

In addition, in the above description, although the example is shown using the organic EL elements as the element for display and the detection element, similar operational effects can be acquired even when another element is used which has a variation over time and/or temperature dependency similar to that of each of the above-mentioned elements.

What is claimed is:

1. A display apparatus having a plurality of light emitting elements constituting a display pixel, a detection element for acquiring a voltage value corresponding to a forward voltage of each of said light emitting elements in order to control a value of a drive voltage for displaying and driving each of said light emitting elements, and a current source for supplying current to said detection element in order to acquire said voltage value from said detection element, said apparatus comprising: a leakage detection means for detecting whether or not leakage takes place in said detection element so as to interrupt the current supply from said current source to said detection element when detecting a leakage state of the detection element, and a pseudo leakage setup means which can set a potential of an anode terminal of said detection element as a pseudo leakage potential which is a potential where the detection element is in the leakage state.

2. The display apparatus as claimed in claim 1, wherein said pseudo leakage potential set up by said pseudo leakage setup means is arranged to be variably set up.

3. The display apparatus as claimed in claim 1, wherein said pseudo leakage setup means is arranged to be able to selectively set up at least one potential out of a plurality of types of potentials as said pseudo leakage potential.

4. The display apparatus as claimed in any one of claims 1 to 3, further comprising an operation detection means for detecting whether or not said leakage detection means is operating.

5. The display apparatus as claimed in claim 4, wherein said operation detection means detects whether or not said leakage detection means is operating by detecting a change of the voltage value at an output terminal of said current source.

6. The display apparatus as claimed in any one of claims 1 to 3, wherein said pseudo leakage setup means comprises at least one switch connected to said anode terminal.

7. The display apparatus as claimed in claim 4, wherein said pseudo leakage setup means comprises at least one switch connected to said anode terminal.

8. The display apparatus as claimed in claim 5, wherein said pseudo leakage setup means comprises at least one switch connected to said anode terminal.

9. The display apparatus as claimed in claim 6, wherein said switch is constituted by a thin film transistor.

10. The display apparatus as claimed in claim 7, wherein said switch is constituted by a thin film transistor.

11. The display apparatus as claimed in claim 8, wherein said switch is constituted by a thin film transistor.

12. A method of inspecting a display apparatus having a plurality of light emitting elements constituting a display pixel, a detection element for acquiring a voltage value corresponding to a forward voltage of each of said light emitting elements in order to control a value of a drive voltage for displaying and driving each of said light emitting elements, and a leakage detection means for detecting whether or not leakage takes place in said detection element so as to interrupt the current from the current source for supplying the current to said detection element when detecting a leakage state of said detection element, wherein a pseudo leakage potential setup operation of setting a potential of an anode terminal of said detection element as a pseudo leakage potential which is a potential where the detection element is in the leakage state is carried out.

13. The method of inspecting the display apparatus as claimed in claim 12, wherein said pseudo leakage potential set up by said pseudo leakage potential setup operation is variably controlled.

14. The method of inspecting the display apparatus as claimed in claim 12, wherein said pseudo leakage potential setup operation is such that at least one potential out of a plurality of types of potentials is selectively set up as said pseudo leakage potential.

15. The method of inspecting the display apparatus as claimed by any one of claim 12 to 14, wherein an operation of determining whether or not said leakage detection circuit is operating is further carried out by detecting a change of the voltage value at an output terminal of the current source for supplying the current to said detection element.

* * * * *